United States Patent [19]
Watanabe et al.

[11] Patent Number: 5,601,905
[45] Date of Patent: Feb. 11, 1997

[54] LAMINATE FOR INSULATION PROTECTION OF CIRCUIT BOARDS

[75] Inventors: Hisashi Watanabe, Kisarazu; Takashi Tanaka, Kimizu; Kaoru Okamoto, Chiba; Keiji Yoshizawa, Futtsu; Hiroyuki Chinju; Isamu Takarabe, both of Kimizu, all of Japan

[73] Assignee: Nippon Steel Chemical Co., Ltd., Japan

[21] Appl. No.: 395,516

[22] Filed: Feb. 27, 1995

Related U.S. Application Data

[63] Continuation of Ser. No. 27,843, Mar. 8, 1993, abandoned.

[30] Foreign Application Priority Data

Mar. 10, 1992 [JP] Japan ................. 4-86208
Mar. 31, 1992 [JP] Japan ................. 4-105596

[51] Int. Cl.$^6$ .............. B32B 7/02; B32B 27/08; C08G 73/10; H05K 3/28
[52] U.S. Cl. ............ 428/215; 428/213; 428/332; 428/352; 428/473.5; 428/901
[58] Field of Search ................. 427/551, 558, 427/566; 428/352, 473.5, 901, 213, 215, 332, 334

[56] References Cited

U.S. PATENT DOCUMENTS 4,939,039  7/1990  Watanabe ................. 428/458

FOREIGN PATENT DOCUMENTS 62-113494   5/1987   Japan .
62-263692  11/1987   Japan .
63-110224   5/1988   Japan .
143847      6/1988   Japan .
2263981     8/1993   United Kingdom .

OTHER PUBLICATIONS

Printed Circuits Handbook, 3rd ed., McGraw-Hill ©1988 Clyde Coombs (ed.), pp. 11.9–11.3.

*Primary Examiner*—D S. Nakarani
*Attorney, Agent, or Firm*—Nixon & Vanderhye

[57] ABSTRACT

A laminate comprising at least two layers of a photosensitive resin layer and a polyimide precursor resin layer; a process for formation of an insulating protective layer using a laminate which comprises laminating a laminate comprising at least photosensitive resin layer and a polyimide precursor resin layer on an insulating board having an exposed circuit; selectively exposing the photosensitive resin layer to active light; developing the resultant photosensitive resin layer; removing the exposed polyimide precursor resin layer by etching it with an alkaline solution using the photosensitive resin layer as a mask; removing the photosensitive resin layer; and then curing the residual polyimide precursor resin layer; and a process for preparation of a printed circuit which comprises forming a polymide precursor resin layer on an insulating board having an exposed circuit, patterning the resin layer with an alkaline solution, and then curing it.

The laminate of this invention can provide extremely easily an insulating protective layer for circuits having a high processing precision and excellent in reliability on insulation. Further, a printed circuit having a high processing precision and excellent in reliability on insulation can be provided extremely easily by the processes of this invention.

9 Claims, 1 Drawing Sheet

5,601,905

LAMINATE FOR INSULATION PROTECTION OF CIRCUIT BOARDS

This is a file wrapper continuation of application Ser. No. 08/027,843, filed Mar. 8, 1993, now abandoned.

FIELD OF THE INVENTION AND RELATED ART STATEMENT

This invention relates to a laminate useful as an insulating protective material for circuit boards, and a process for formation of an insulating protective layer for a printed circuit.

Heretofore, as a process for insulation and protection of a circuit board there have already been put into practice a process which comprises protecting it by an ink applied thereon by a screen printing process (Japanese Published Unexamined Patent Application No. 263692/1987), a process which comprises laminating a film coated with an adhesive called a coverlay film (Japanese Published Unexamined Patent Application No. 110224/1988), etc.

In the former process, the ink is generally composed of a resin having no heat resistance and a protective layer is applied using a screen, and thus there has been a difficulty in adaptation to recent fine patterns from the viewpoint of its printing precision. The latter process is excellent in reliability on insulation of a protective layer based on the fact that a polyimide film excellent in heat resistance is used as the protective layer, but had problems that it needs complicated processing steps of punching out the polyimide film using a metal mold and laminating the resultant film on a circuit board by hot pressing, and that since punching out precision is low and thus it cannot sufficiently comply with fine patterns in view of processing precision, as is the case with the ink protective layer.

On the other hand, a process which comprises providing directly a polyimide resin on a circuit by any method and then etching and patterning it with a chemical (Japanese Published Unexamined Patent Application No. 113494/1987 and the like) is also partly put into practice, but it had problems that in this process it is unavoidable to use a harmful chemical such as hydrazine or ethylenediamine and it take a long time for the etching.

OBJECT AND SUMMARY OF THE INVENTION

An object of this invention lies in providing an insulating protective material for circuit boards excellent in reliability on insulation and processing precision and in workability.

Another object of this invention lies in providing a process for preparation of an insulating protective layer for printed circuits, excellent in reliability on insulation and processing precision and in workability.

The first object of this invention was solved by a laminate comprising at least two layers of a photosensitive resin layer and a polyimide precursor resin layer.

The second object of this invention was solved by a process for formation of an insulating protective layer using a laminate which comprises laminating a laminate comprising at least photosensitive resin layer and a polyimide precursor resin layer on an insulating board having an exposed circuit; selectively exposing the photosensitive resin layer to active light; developing the resultant photosensitive resin layer; removing the exposed polyimide precursor resin layer by etching it with an alkaline solution using the photosensitive resin layer as a mask; removing the photosensitive resin layer; and then curing the residual polyimide precursor resin layer; and a process for preparation of a printed circuit which comprises forming a polyimide precursor resin layer on an insulating board having an exposed circuit, patterning the resin layer with an alkaline solution, and then curing it.

Figure 1:
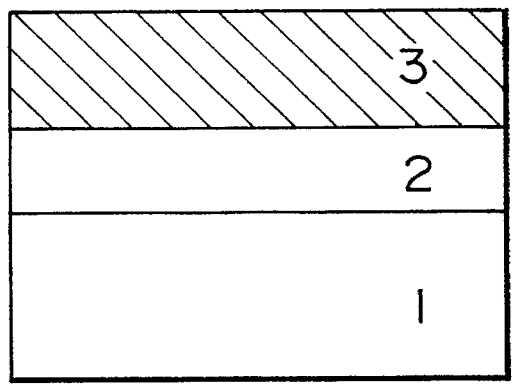
FIG. 1 is a cross section showing the layer structure of the laminate of this invention.
Figure 2:
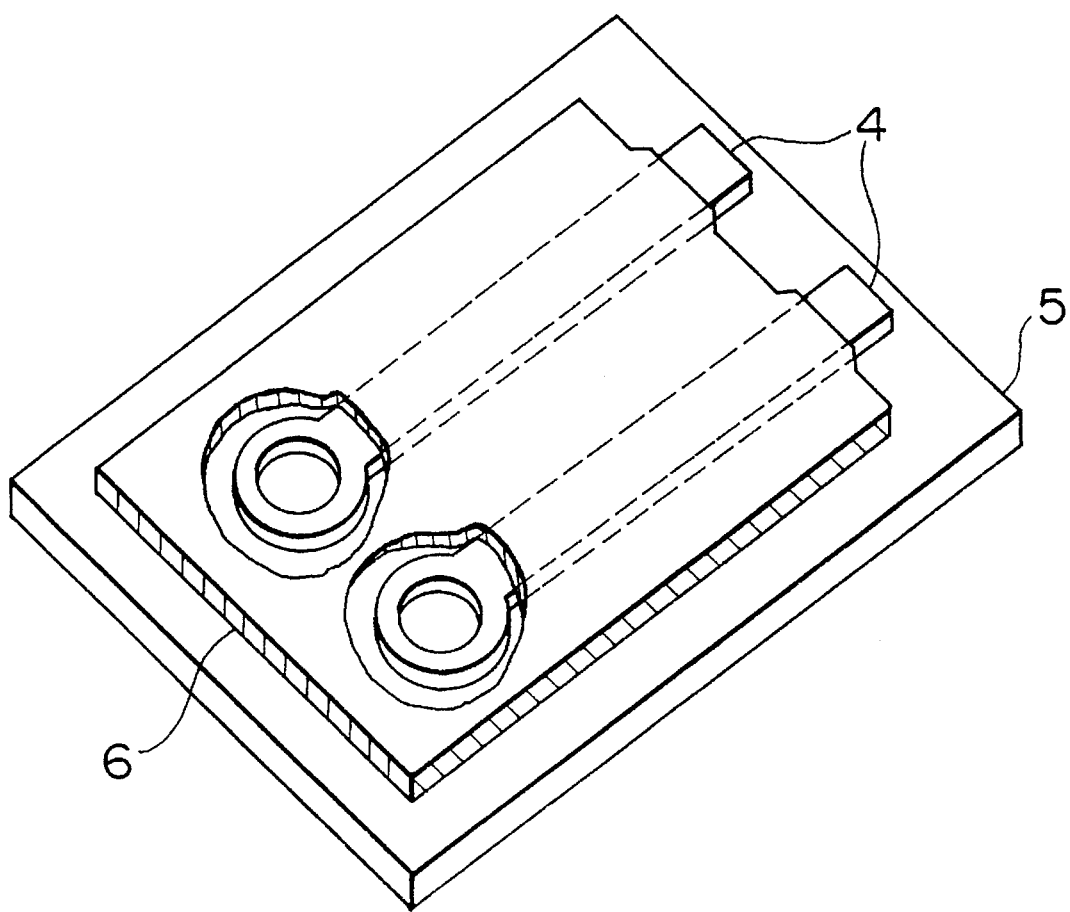
FIG. 2 is a schematic drawing showing the state of a printed circuit obtained by the process of this invention.

Figures in FIG. 1 and FIG. 2 have the following meanings. 1. Release film layer, 2. Photosensitive resin layer, 3. Polyimide precursor resin layer, 4. Circuit, 5. Board resin surface, 6. Polyimide insulating protective layer

DETAILED DESCRIPTION OF THE PREFERRED EMBODIMENTS

As for photosensitive resin layers, those having any structure can be selected, and both negative type and positive type ones can be used. Photosensitive resins include, usually, ultraviolet ray-reactive type ones, electron beam-reactive type ones, etc., and each are composed of a base oligomer, a reactive diluent, a photopolymerization initiator, a photosensitizer, a pigment, a polymerization inhibitor, etc. Base oligomers include epoxy acrylate, urethane acrylate, polyester acrylate, etc.

Its thickness is preferably from 2 µm to 100 µm, and when the thickness is below 2 µm, processing precision is high, but membrane strength is insufficient, and when the polyimide precursor resin layer is etched, problems of peeling, etc. are liable to occur. When the thickness is above 100 µm, strength is large and reliability is high, but processing precision lowers and it takes much costs.

A polyimide precursor resin can be synthesized by reacting a diamine compound, usually, with a tetracarboxylic acid anhydride compound in a polar solvent at 0° to 200° C. When imidization reaction occurs during the synthesis, solubility lowers and etching time in patterning becomes longer, and such a situation is undesirable.

As polar solvents, there can be mentioned N-methylpyrrolidone (NMP), dimethylformamide (DMF), dimethylacetamide (DMAc), dimethyl sulfoxide (DMSO), dimethyl sulfate, sulfolane, butyrolactone, cresol, phenol, halogenated phenol, cyclohexane, dioxane, tetrahydrofuran, diglyme, etc.

As diamine compounds, there can be mentioned diamines such as p-phenylenediamine, m-phenylenediamine, 2'-methoxy-4,4'-diaminobenzanilide, 4,4'-diaminodiphenyl ether, diaminotoluene, 4,4'-diaminodiphenylmethane, 3,3'-dimethyl-4,4'-diaminodiphenylmethane, 3,3'-dimethyl-4,4'-diaminodiphenylmethane, 2,2-bis[4-(4-aminophenoxy)phenyl]propane, 1,2-bis(anilino)ethane, diaminodipheylsulfone, diaminobenzanilide, diaminobenzoates, diaminodiphenyl sulfide, 2,2-bis(p-aminophenyl)propane, 2,2-bis(p-aminophenyl)hexafluoropropane, 1,5-diaminonaphthalene, diaminotoluene, diaminobenzotrifluoride, 1,4-bis(p-aminophenoxy)benzene, 4,4'-(p-aminophenoxy)biphenyl, diaminoanthraquinone, 4,4'-bis(3-aminophenoxyphenyl)diphenyl sulfone, 1,3-bis(anilino)hexafluoropropane, 1,4-bis(anilino)octafluoropropane, 1,5-bis(anilino)decafluoropropane, 1,7-bis(anilino)tetradecafluoropropane, diaminosiloxanes represented by the following general formula

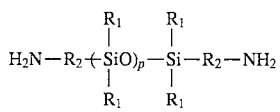

or

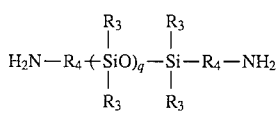

(wherein $R_2$ and $R_4$ each represent a divalent organic group, $R_1$ and $R_3$ each represent a monovalent organic group, and p and q each represent an integer larger than 1), 2,2-bis-[4-(p-aminophenoxy)phenyl]hexafluoropropane, 2,2-bis-[4-(3-aminophenoxy)phenyl]hexafluoropropane, 2,2-bis-[4-(2-aminophenoxy)phenyl]hexafluoropropane, 2,2-bis-[4-(4-aminophenoxy)-3,5-dimethylphenyl]hexafluoropropane, 2,2-bis-[4-(4-aminophenoxy)-3,5-ditrifluoromethylphenyl] hexafluoropropane, p-bis-(4-amino-2-trifluoromethylphenoxy)benzene, 4,4'-bis(4-amino-3-trifluoromethylphenoxy) biphenyl, 4,4'-bis(4-amino-2-trifluoromethylphenoxy)diphenyl sulfone, 4,4'-bis(4-amino-5-trifluoromethylphenoxy)diphenyl sulfone, 2,2-bis[4-(4-amino-3-trifluoromethylphenoxy)phenyl]hexafluoropropane, benzidine, 3,3',5,5'-tetramethylbenzidine octafluorobenzidine, 3,3'-methoxybenzidine, o-tolidine, m-tolidine, 2,2',5,5',6,6'-hexafluorotolidine, 4,4''-diaminoterphenyl and 4,4'''-diaminoquarterphenyl, and diisocyanates obtained by reaction of these diamines with phosgene or the like.

Further, as tetracarbonic acid anhydrides and their derivatives, the following ones can be mentioned. In this connection, although tetracarboxylic acids are exemplified below, esters, acid anhydrides, acid chloride thereof can, of cource, be used. There can be mentioned pyromellitic acid, 3,3',4,4'-biphenyltetracarboxylic acid, 3,3',4,4'-benzophenonetetracarboxylic acid, 3,3',4,4'-diphenyl sulfone tetracarboxylic acid, 3,3',4,4'-diphenyl ether tetracarboxylic acid, 2,3,3',4'-benzophenonetetracarboxylic acid, 2,3,6,7-naphthalenetetracarboxylic acid, 1,2,5,6-naphthalenetetracarboxylic acid, 3,3',4,4'-diphenylmethanetetracarboxylic acid, 2,2-bis(3,4-dicarboxyphenyl)propane, 2,2-bis(3,4-dicarboxyphenyl)hexafluoropropane, 3,4,9,10-tetracarboxyperylene, 2,2-bis [4-(3,4-dicarboxyphenoxy)phenyl]propane, 2,2-bis[4-(3,4-dicarboxyphenoxy)phenyl]hexafluoropropane, butanetetracarboxylic acid, cyclopentanetetracarboxylic acid, etc. Further, trimellitic acid and their derivatives can be mentioned, too.

Further, a polyimide precursor resin to be used in this invention may be a modified polyimide precursor resin obtained by modifying a polyimide precursor resin obtained in the above manner with a compound having reactive functional group (s) to introduce a crosslinking structure or a ladder structure. Such modification processes include, for example, the following processes.

(a) A polyimide precursor resin is modified with a compound represented by the following general formula (3) to introduce a pyrrolone ring, an isoindoloquinazolinedione ring or the like.

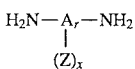

(Wherein Ar is a 2+x valent aromatic residue, x represents 1 or 2 and z is a substituent selected from an —$NH_2$ group, a —$CONH_2$ group or a —$SO_2NH_2$ group, and is located at the o-position to the amine group)

(b) A polyimide precursor resin is modified with a derivative of an amine, a diamine, a dicarboxylic acid, a tricarboxylic acid or a tetracarboxylic acid having a polymerizable unsaturated bond. Thereby a crosslinkage structure is formed at the time of curing. As compounds having a polymerizable unsaturated bond, there can be used maleic acid, nadic acid, tetrahydrophthalic acid, ethynylaniline, etc.

(c) A polyimide precursor resin is modified with an aromatic amine having a phenolic hydroxyl group or a carboxyl group. Crosliking structure is formed at the time of curing using a compound capable of reacting with this hydroxyl group or carboxyl group.

In this invention the thus obtained polyimide precursor is provided in a film state adjacent to the photosensitive resin layer, and it is preferable that the coefficient of thermal expansion of the resin layer after curing is $3\times10^{-5}$/°C. or less. Particularly when the resin layer is provided on a flexible circuit such as a flexible printed circuit board and the coefficient of thermal expansion is beyond $3\times10^{-5}$/°C., a hindrance on a practical use tends to occur that the circuit warps at the time of cooling after heat treatment under a high temperature in the imdization reaction or the like.

The polyimide precursors used in this invention are more preferably polyimide precursors having a repetition unit represented by the formula (1) or (2), and polyimides obtained by curing them have a small coefficient of thermal expansion and are excellent in mechanical characteristics such as flexing properties.

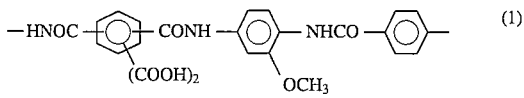

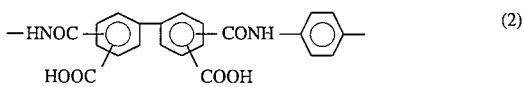

As an alternative, it is also possible, for the purposes of control of a coefficient of thermal expansion, adjustment of mechanical characteristics, to copolymerize a polyimide precursor resin having a repetition unit represented by the formula (1) or (2) with any compound other than it or to blend such a compound therein. Further, it is also possible, for the purpose of improvement of various characteristics, to mix with a polyimide precursor resin an inorganic or organic powder, fiber, chopped strand or the like. There can be mentioned silica, alumina, talc, metal powders, etc. as inorganic powders; ceramic fibers, etc. as inorganic fibers; resin powders, etc. as organic powders. Further, it is also possible to add to a polyimide precursor resin an additive such as an antioxidant in order to prevent oxidation of the circuit at the time of curing, or a silane coupling agent in order to enhance the adhesive property. Further, it is also possible to blend in a polyimide precursor resin a heterogeneous polymer for the purpose of enhancement of flexibility, enhancement of fluidity or adhesive property, or the like.

Further, it is also possible to modify the terminal group of a polyimide precursor resin for various purposes. For example, there can be mentioned a process which comprises esterifying the acid anhydride terminus of a polyimide precursor resin to suppress reaction in a solution state and making the ester group react at the time of curing to obtain a polyimide having a higher molecular weight, a process which comprises forming an acetyl group at the terminus of a polyimide precursor resin to improve adhesive properties, etc., or the like.

The thickness of the polyimide precursor resin layer is preferably 2 to 300 μm, and when it is less than 2 μm, the polyimide obtained by curing is poor in reliability on the insulation of the circuit and further poor in mechanical properties such as a bending property. When it is beyond 300 μm, deterioration reaction is liable to occur in the imidization reaction and such a condition is undesirable.

The reduced viscosity of a polyimide precursor resin can be controlled by changing the quantity of the diamine compound and the quantity of the tetracarboxylic acid, and is preferably in the range of 0.3 to 2.0. When a polyimide precursor resin having a reduced viscosity above 2.0 is used, it takes much time to etch it in patterning with an alkaline soution, and, sometimes, sufficient etching cannot be made and the membrane remains. Further, when the reduced viscosity is below 0.3, the polyimide film obtained by curing is brittle and such a condition is undesirable,.

The thus prepared polyimide precursor is contacted with a photosensitive resin layer to form a layer, and as a process for the formation any process can be adopted. As a process further excellent in workability, there can be mentioned a process which comprises applying a photosensitive resin on a release film and then applying a polyimide precursor resin solution thereon.

As release films, there can be selected general films such as polyester films, polypropylene films and polyimide films, and films coated with a releasing agent such as a silicone compound in order to further increase release properties are further preferable.

The temperature of drying of the polyimide precursor resin solution after application can be selected in a range such that the photosensitive resin or the release film does not, but is preferably room temperature to 180° C. When the drying temperature is above 180° C., imidation reaction takes place, and the fluidity of the resin lowers in the succeeding lamination onto the circuit and thereby a packing property lowers, or etching time in patterning becomes longer, and thus such a condition is undesirable.

It is possible to adjust a drying state taking into account a packing property at the time of lamination or tackiness to the circuit. Further, it is also possible, for protection of the surface of the polyimide precursor resin layer, to laminate a release film in contact therewith.

The thus obtained laminate is laminated on a circuit board on which any circuit pattern was drawn so that the polyimide precursor resin layer comes in contact therewith. As circuit boards, there can be used any circuit boards, for example, hard boards such as glass epoxy boards and glass maleimide boards, flexible printed circuit boards wherein a polyimide film is used, etc., but since it is necessary, thereafter, to cure the polyimide precursor layer at a high temperature, circuit boards excellent in heat resistance are further preferable such as glass/maleimide hard boards and flexible printed boards free of any adhesive.

It is possible in this invention to lower the coefficient of thermal expansion of the insulating protective layer, and thus particularly when a flexible printed circuit having a thickness of 0.5 mm or less, it is possible to suppress the curl of the flexible printed circuit board which has hitherto come into a problem by use of an insulating protective layer having a low coefficient of thermal expansion.

Lamination can be made using a thermal press or a roll-to-roll laminator. In this occasion it is further preferable to heat the polyimide precursor resin layer to 60° to 200° C. in order to increase the packing property of the resin. Further, it is also possible to supply a dip coating liquid such as an organic solvent to the interface in order to further enhance its adhesion to the printed circuit.

Then, in order to process the polyimide precursor resin layer into any shape, any negative pattern or positive pattern is superposed on the release film or directly on the photosensitive resin layer, and exposure to active light is made. The resultant photosensitive resin layer is developed, and then the polyimide precursor is etched using an alkaline solution. It is possible to make the etching under heating to raise the etching speed. Finally, the remaining photosensitive resin layer is removed to obtain a patterned polyimide precursor insulating resin layer.

It is possible to use as the alkaline solution to be used for etching any of usual inorganic chemicals such as sodium hydroxide, potassium hydroxide, ammonia and hydrazine, organic chemicals such as ethylenediamine and pyridine, and mixed chemicals thereof. Further, it is also possible to make the etching in the presence of an organic solvent in order to increase the etching speed. Further, it becomes no hindrance to heat the polyimide precursor resin layer aiming at increase of the etching speed, and application of the chemical in a shower state makes more effective etching possible.

After patterning in the above manner, the top photosensitive resin layer is removed with a chemical. As such a chemical, there can be used an organic chemical having a high dissolving power such as methylene chloride or trichloroethane, or an oxygenic chemical having a high decomposing power such as a hologenous peroxide, or the like, and a chemical is selected which does not have a bad influence on the polyimide precursor resin layer. The removal operation is made by immersing the photosensitive resin layer in a removing solution containing such a chemical, or by spraying the removing solution thereon.

Then, the resultant exposed on its whole surface and patterned polyimide precursor resin layer is washed with water. Washing is an important step for removal of an alkaline chemical used for etching and a chemical used for removal of the photosensitive resin layer, and if it is insufficient, deterioration of the polimide precursor resin layer at the time of succeeding curing or the polyimide resin layer obtained by the curing is liable to occur. Preferably, ion exchanged water or distilled water is used as the washing water.

The thus obtained polyimide precursor insulating resin layer is subjected to heat treatment at a high temperature to curing reaction as an imidization reaction. The heat treatment temperature can be 200° C. to 400° C., preferably 250° C. to 300° C. Heating can be either batch heating using a hot air oven or roll-to-roll heating. It is preferable to make the heat treatment in an inert atmosphere becauce oxidation of the circuit can be suppressed.

This invention also relates to a process for preparation of a printed circuit which comprises forming a polyimide precursor resin layer on an insulating board having an exposed circuit, patterning the resin layer with an alkaline solution, and then curing it.

Any process can be adopted as a process for formation of a polyimide precursor resin layer on the insulating board. One process therefor is a process which comprises applying thereon a solution of a polyimide precursor resin and drying it, and can be carried out using screen process printing, roll coating, die coating or the like. The drying temperature is preferably 200° C. or less which does not causes imidization reaction. Another process is a process which comprises laminating a polyimide precursor resin made into film in advance. In this process, it is also possible to make the lamination under heating or make a solution for the polyimide procursor resin exist in the interface, in order to make the packing property between the circuits better.

The thus obtained polyimide precursor resin layer is then patterned. The following processes can be utilized as pattern forming processes. One process is a process which comprises providing on the resin layer a photosensitive resin layer, patterning the photosensitive resin layer and then etching the polyimide precursor resin layer with an alkali. Another process is a process which comprises forming a pattern on the polyimide precursor resin layer with an alkali resistant ink by screen process printing, and then etching the resin with an alkali.

It is possible in the former process to obtain a pattern with a high precision. The photosensitive resin and the thickness of the photosensitive resin layer may be the same with the case of the above-described laminate.

As a process for lamination of the photosensitive resin, there is a process which comprises appling it on the polyimide precursor resin layer by roll coating, screen process printing or the like, or a process which comprises laminating the photosensitive resin made into film in advance on the polyimide precursor resin.

Although the latter process comprising making patterning with an alkali resistant ink can comprise more simplified steps, pattern precision thereby is inferior to the former process. As a characteristic of the ink is necessary resistance to the alkali with which the polyimide precursor resin layer is etched.

The succeeding alkali etching can be made in the same manner as in the case of use of the laminate, the removal of the top photosensitive resin layer or the ink with a chemical can be made in the same manner as in the removal of the photosensitive resin layer as in the case of use of the laminate, and the subsequent washing and curing can also be made in the same manner as in the case of the laminate.

This invention is more detailedly described below according to examples.

In examples, measurement of a coefficient of thermal expansion was made, on a sample after sufficient completion of imidization reaction, using a thermomechanical analyzer (TMA). In this invention, a coefficient of thermal expansion is defined as a mean coefficient of thermal expansion from 240° C. to 100° C. in a case where a sample is cooled at a rate of 10° C./min after temperature rise to 250° C.

Solder resistance is defined as the maximum temperature at which swelling and peeling do not occur when a circuit left at 76% RH for 24 hours is immersed in a solder bath for one minute, and was investigated every 10° C.

Processing precision was determined by etching processing the polyimide precursor resin layer using a pattern having circles having diameters different every 10 μm, and defermining the resultant minimum circle having a good shape by visual observation. In this connection, processing precision is defined as the diameter of the minimum circle,.

Reduced viscosity was calculated based on the following equation.

$$\text{Reduced viscosity} = \ln(t/t_0)/C \; dl/g$$

wherein C represents the gram number of a polymer in 1 dl of its solution, $t_0$ represents the time of go flow out of the solvent alone, and t represents the time of go flow out of the solution.

SYNTHETIC EXAMPLE 1

0.07 mole of 2'-methoxy-4,4'-diaminobenzanilide and 0.03 mole of 4,4'-diaminodiphenyl ether were dissolved, under stirring, in 220 ml of DMAc (dimethylacetamide) in a 300-ml four-necked flask equipped with a thermometer, a calcium chloride tube, a stirring bar and a nitrogen supply port, while nitrogen was introduced therein at a rate of 200 ml/min. While the resultant solution was cooled in a water bath to 10° C. or less, 0.10 mole of PMDA (pyromellitic dianhydride) was gradually added. Thereafter, stirring was continued at room temperature for about 2 hours to carry out polymerization reaction. Thereby, a brown, transparent and viscous polyimide precursor solution was obtained. Its reduced viscosity was 0.80.

SYNTHETIC EXAMPLE 2

0.08 mole of p-phenylenediamine and 0.02 mole of 4,4'-diaminodiphenyl ether were dissolved, under stirring, in 220 ml of NMP (N-methyl-2-pyrrolidone) in a 300-ml four-necked flask equipped with a thermometer, a calcium chloride tube, a stirring bar and a nitrogen supply port, while nitrogen was introduced therein at a rate of 200 ml/min. While the resultant solution was cooled in a water bath to 10° C. or less, 0.10 mole of 3,3',4,4'-biphenyltetracarboxylic acid anhydride was gradually added. Thereafter, stirring was continued at room temperature for about 2 hours to carry out polymerization reaction. Thereby, a brown, transparent and viscous polyimide precursor solution was obtained. Its reduced viscosity was 0.70.

SYNTHETIC EXAMPLE 3

0.10 mole of 4,4'-diaminodiphenylmethane was dissolved, under stirring, in 220 ml of DMAc (dimethylacetamide) in a 300-ml four-necked flask equipped with a thermometer, a calcium chloride tube, a stirring bar and a nitrogen supply port, while nitrogen was introduced therein at a rate of 200 ml/min. While the resultant solution was cooled in a water bath to 10° C. or less, 0.10 mole of BTDA (3,3',4,4'-benzophenonetetracarboxylic acid anhydride) was gradually added. Thereafter, stirring was continued at room temperature for about 2 hours to carry out polymerization reaction. Thereby, a yellow, transparent and viscous polyimide precursor solution was obtained. Its reduced viscosity was 0.70.

SYNTHETIC EXAMPLE 4

0.07 mole of 2'-methoxy-4,4'-diaminobenzanilide and 0.03 mole of 4,4'-diaminodiphenyl, ether were dissolved, under stirring, in 220 ml of DMAc (dimethylacetamide) in a 300-ml four-necked flask equipped with a thermometer, a calcium chloride tube, a stirring bar and a nitrogen supply port, while nitrogen was introduced therein at a rate of 200 ml/min. While the resultant solution was cooled in a water bath to 10° C. or less, 0.101 mole of PMDA (pyromellitic dianhydride) was gradually added. Thereafter, stiring was continued at room temperature for about 2 hours to carry out polymerization reaction. Thereby, a brown, transparent and viscous polyimide precursor solution was obtained. Its reduced viscosity was 3.10.

SYNTHETIC EXAMPLE 5

0.07 mole of 2'-methoxy-4,4'-diaminobenzanilide and 0.03 mole of 4,4'-diaminodiphenyl ether were dissolved, under stirring, in 220 ml of DMAc (dimethylacetamide) in a 300-ml four-necked flask equipped with a thermometer, a calcium chloride tube, a stirring bar and a nitrogen supply port, while nitrogen was introduced therein at a rate of 200 ml/min. While the resultant solution was cooled in a water bath to 10° C. or less, 0.088 mole of PMDA (pyromellitic dianhydride) was gradually added. Thereafter, stirring was continued at room temperature for about 2 hours to carry out polymerization reaction. Thereby, a brown, transparent and viscous polyimide precursor solution was obtained. Its reduced viscosity was 0.20.

EXAMPLE 1

The polyimide precursor resin solution obtained in Synthetic example 1, was applied, using an applicator, onto the emulsion surface of a commercially available photosensitive direct film for screen printing process [produced by Murakami Screen Co., Ltd., MS-FILM (diazo emulsion 30 μm/release polyester film 75 μm)] so that the thickness after drying became 50 μm. The resultant film was dried in a hot air circulating oven at 130° C. for 4 minutes to obtain a laminate of three-layer structure of release polyester film/photosensitive resin layer/polyimide precursor resin layer.

This laminate was laminated on an adhesive-free copper-clad laminate circuit-processed in advance [produced by Nippon Steel Chemical Co., Ltd., ESPANEX™ (rolled copper foil 35 lμm/polyimide 35 μm)]. The circuit was a parallel circuit having a line width of 300 μm and a line spacing of 300 μm. A solution obtained by mixing DMAc with ethyl alcohol in a ratio of 1 to 3 was sprayed on the circuit surface using a sprayer, and the laminate of the three-layer structure was laminated on the whole surface of the circuit at a roll temperature of 90° C. using a laminator (produced by Taisei Laminator Co., Ltd., ST Laminator 8B-550ID) so that the polyimide precursor resin layer came in contact with the circuit surface. The polyimide precursor resin layer was neatly packed between the circuits, and entrainment of bubbles was not observed.

Further, a negative film having a 3 cm×10 cm pattern was placed in contact with the release film, exposure to active light of about 1,000 mmNJ/cm$^2$ was carried out using an electric discharge lamp apparatus for exposing to light (produced by Hightec Co., Ltd., 3000 NEL), the release film was peeled, and the photosensitive resin layer was developed with water at a water temperature of 23° C. and a water pressure of 1 kg/cm$^2$ for 80 seconds using a simple vertical shower apparatus.

Further, after drying at 80° C. for one minute or so, the polyimide precursor resin layer was etching processed with 5% sodium hydroxide solution at a solution temperature of 33° C. and a water pressure of 1.5 kg/cm$^2$ for 60 seconds using a simple vertical shower apparatus. The exposed polyimide precursor resin layer was etching removed without any residue.

A shower was then made at a water pressure of 1.0 kg/cm$^2$ for 2 minutes using a remover (produced by Murakami Screen Co., Ltd., STRIP SUPER) to remove the remaining photosensitive resin layer. The resultant board coated only with the patterned polyimide precursor resin layer was heat treated in a hot air oven at 130° C. for 10 minutes, and then heat treated by stage at 160°, 200°, 250° and 300° C. each for 2 minutes.

The resultant flexible printed circuit had a polyimide layer of a thickness of 33 μm as an insulating layer, and when its section was observed by a microscope, the circuit was covered with the polyimide layer in a uniform thickness without any void. Further, the appearance of the board had extremely good flatness. As for its characteristics, the board had a solder resistance such that it withstood a high temperature of up to 350° C., and when it was bent by hand along with circuit, it was not broken and thus it had high mechanical characteristics..

Further, when the processing precision of the polyimide precursor resin layer was evaluated using the above-mentioned pattern for judgment of processing precision, the layer was neatly processed up to the circle having a diameter of 100 μm, and the processing precision was much better than in punching of coverlay film. The cofficient of thermal expansion of insulating polyimide resin layer obtained by curing was $2.0 \times 10^{-5}/°C$.

EXAMPLE 2

Processing and evaluation were made in the same manner as in Example 1 using the polyimide precursor resin solution obtained in Synthetic example 2.

The resultant flexible printed circuit had a solder resistance of 330° C., a good bending property, and excellent flatness. Further, the processing precision of the polyimide precursor resin layer was 100 μm, as is the case in Example 1. The coefficient of thermal expansion of the polyimide resin layer was $2.2 \times 10^{-5}/°C$.

EXAMPLE 3

Processing and evaluation were made in the same manner as in Example 1 using the polyimide precursor resin solution obtained in Synthetic example 3.

The resultant flexible printed circuit had a solder resistance of 330° C. and a good bending property, but as for the flatness, a rise at the corner of 10 mm or so in a pattern of 3 cm×10 cm was observed on the bench. However, that is a level causing no inconvenience for use. The processing precision of the polyimide precursor resin layer was likewise 100 μm. The cofficient of thermal expansion of the polyimide resin layer was $5.0 \times 10^{-5}/°C$.

EXAMPLE 4

Processing and evaluation were made in the same manner as in Example 1 using the polyimide precursor resin solution obtained in Synthetic example 4. It took 3 minutes to make alkali etching under the same conditions as in Example 1, and therefore, the state of processing became fairly worse due to side etching.

The resultant flexible printed circuit had a solder resistance of 330° C. and a good bending property, and also had excellent flatness. The cofficient of thermal expansion of the polyimide resin layer was $2.0 \times 10^{-5}/°C$.

EXAMPLE 5

Processing and evaluation were made in the same manner as in Example 1 using the polyimide precursor resin solution obtained in Synthetic example 5.

The resultant flexible printed circuit had a solder resistance of 300° C. and excellent flatness. As for its bending property, a few cracks were formed in the polyimide resin layer at a bending of 180°. The cofficient of thermal expansion of the polyimide resin layer was $2.2 \times 10^{-5}/°C$.

EXAMPLE 6

The polyimide precursor resin solution obtained in Synthetic example 1 was applied onto the whole surface of the same circuit board as in Example 1 using a roll coater. The resultant board was dried at 130° C. for 10 minutes, an etching-resistant ink (produced by Taiyo Ink Co., Ltd., M-85K) was applied onto the resultant resin surface through a screen plate having a pattern of 3cm×10 cm (200 mesh, emulsion thickness 30 μm), the resultant resin layer was etched with an alkaline solution after drying and curing of the ink, in the same manner as in Example 1, the ink was peeled with trichlene, and then heat treatment was made under the same conditions as in Example 1.

The resultant flexble printed circuit had a solder resistance of 330° C., a good bending property and excellent flatness. The cofficient of thermal expansion of the polyimide resin layer was 2. 0×10⁻⁵/°C.

EXAMPLE 7

The polyimide precursor resin solution obtained in Synthetic example 1 was applied onto the whole surface of the same circuit board as in Example 1 using a roll coater (the thickness of the coat after drying: 40 μm). After drying at 130° C. for 10 minutes, a photosensitive direct film for screen printing process [produced by Murakami Screen Co., Ltd., MS-FILM (diazo emulsion 30 μm/release polyester film 75 μm)] was laminated on the resin surface. Thereafter, etching and curing of the polyimide precursor resin were made in the same manner as in Example 1.

The resultant flexble printed circuit had a solder resistance of 330° C., a good bending property, and excellent flatness. The cofficient of thermal expansion of the polyimide resin layer was 2. 1×10⁻⁵/°C.

What is claimed is:

1. A laminate for insulation protection of circuit boards, the laminate comprising a release sheet having provided on one side thereof, a photosensitive resin layer and a polyimide precursor resin layer,
wherein,
the photosensitive resin is an ultraviolet ray-reactive or electron beam-reactive photosensitive resin having a thickness of 2 to 100 μm, and the polyimide precursor resin is obtained by the reaction of:
(A) a diamine compound or a diisocyanate obtained by reaction of a diamine compound with phosgene, with
(B) a tetracarboxylic acid or trimellitic acid, or an acid anhydride, acid chloride or ester of a tetracarboxylic acid or trimellitic acid, and has a thickness of 2 to 300 μm,
with the proviso that the laminate does not include a circuit board.

2. The laminate according to claim 1 wherein the polyimide precursor resin has a reduced viscosity of 0.3 to 2.0 dl/g.

3. The laminate according to claim 1 wherein the polyimide precursor resin has the repetition unit of the following formula (1) in such a polymeritation degree that its reduced viscosity becomes 0.3 to 2.0.

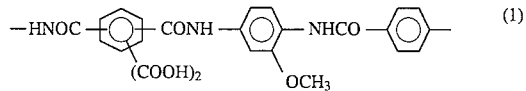
(1)

4. The laminate according to claim 1 wherein the polyimide precursor resin has the repetion unit of the following formula (2) in such a polymerization degree that its reduced viscosity becomes 0.3 to 2.0.

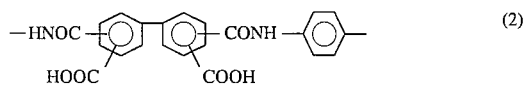
(2)

5. The laminate according to claim 1 wherein the polyimide precursor resin is such that a polyimide resin obtained by curing thereof has a coefficient of thermal expansion of 3×10⁻⁵/°C. or less.

6. The laminate according to claim 1 wherein the polyimide precursor resin is a polyimide precursor resin obtained by reaction of:
a diamine selected from the group consisting of p-phenylenediamine; m-phenylenediamine; 2'-methoxy-4,4'-diaminobenzanilide; 4,4'-diaminodiphenyl ether; diaminotoluene; 4,4'-diaminodiphenylmethane; 3,3'-dimethyl-4,4'-diaminodiphenylmethane; 3,3'-dimethyl-4,4'-diaminodiphenylmethane; 2,2-bis[4-4(4-aminophenoxy)phenyl]propane; 1,2-bis(anilino)ethane; diaminodiphenylsulfone; diaminobenzanilide; diaminobenzoates; diaminodiphenyl sulfide; 2,2-bis(p-aminophenyl)propane; 2,2-bis(p-aminophenyl) hexafluoropropane; 1,5-diaminonaphthalene; diaminotoluene; diaminobenzotrifluoride; 1,4-bis(p-aminophenoxy)benzene; 4,4'-(p-aminophenoxy) biphenyl; diaminoanthraquinone; 4,4'-bis(3-aminophenoxyphenyl) diphenyl sulfone; 1,3-bis(anilino)hexafluoropropane; 1,4-bis(anilino)octafluoropropane; 1,5-bis(anilino)decafluoropropane; 1,7-bis(anilino)tetradecafluoropropane; diaminosiloxanes represented by the following formula:

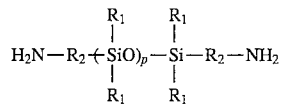

wherein R₂, represents a divalent organic group, R₁ represents a monovalent organic group, and p represents an integer larger than 1,2,2-bis-[4-(p-aminophenoxy)phenyl] hexafluoropropane; 2,2-bis-[4-(3-aminophenoxy)phenyl] hexafluoropropane; 2,2-bis-[4-(2-aminophenoxy)phenyl] hexafluoropropane; 2,2- bis-[4-(4-aminophenoxy)-3,5-dimethylphenyl]hexafluoropropane; 2,2-bis-[4-(4-aminophenoxy)-3,5-ditrifluoromethylphenyl] hexafluoropropane; p-bis-(4-amino-2-trifluoromethylphenoxy)benzene; 4,4'-bis(4-amino-3-trifluoromethylphenoxy)biphenyl; 4,4'-bis(4-amino-2-trifluoromethylphenoxy)diphenyl sulfone; 4,4'-bis(4-amino-5-trifluoromethylphenoxy)diphenyl sulfone; 2,2-bis [4-(4-amino-3-trifluoromethylphenoxy)phenyl] hexafluoropropane; benzidine; 3,3'-methoxybenzidine; o-tolidine; m-tolidine; 2,2',5,5',6,6'-hexafluorotolidine; 4,4"-diaminoterphenyl; 4,4'''-diaminoquarterphenyl and a diisocyanate obtained by reaction of such a diamine with phosgene, with
a tetracarboxylic acid or trimellitic acid, or an acid anhydrides, acid chloride or ester of a tetracarboxylic acid or trimellitic acid, wherein the tetracarboxylic acid is selected from the group consisting of pyromellitic acid; 3,3',4,4'-biphenyltetracarboxylic acid; 3,3',4,4'-benzophenonetetracarboxylic acid; 3,3',4,4'-diphenyl sulfone tetracarboxylic acid; 3,3',4,4'-diphenyl ether tetracarboxylic acid, 2,3,3',4'-benzophenonetetracarboxylic acid; 2,3,6,7-naphthalenetetracarboxylic acid; 1,2,5,6-naphthalenetetracarboxylic acid; 3,3'4,4'-diphenylmethanetetracarboxylic acid; 2,2-bis(3,4-dicarboxyphenyl)propane; 2,2-bis(3,4-dicarboxyphenyl) hexafluoropropane; 3,4,9,10-tetracarboxyperylene; 2,2-bis[4-(3,4-dicarboxyphenoxy)phenyl]propane; 2,2-bis[4-(3,4-dicarboxyphenoxy)phenyl]hexafluoropropane; butanetetracarboxylic acid and cyclopentane-tetracarboxylic acid.

7. The laminate according to claim 1, wherein the release sheet has thereon the photosensitive resin layer and said polyimide precursor resin layer in this order.

8. The laminate according to claim 1 wherein the release sheet has thereon said polyimide precursor resin layer and the photosensitive resin layer in this order.

9. A laminate for insulation protection of circuit boards, the laminate consisting essentially of a release sheet having provided on one side thereof, a photosensitive resin layer, a polyimide precursor resin layer, and optionally, as a top layer, another release sheet wherein, the photosensitive resin is an ultraviolet ray-reactive or electron beam-reactive photosensitive resin having a thickness of 2 to 100 μm, and the polyimide precursor resin is obtained by the reaction of
(A) a diamine compound or a diisocyanate obtained by reaction of a diamine compound with phosgene, with
(B) a tetracarboxylic acid or trimellitic acid, or an acid anhydride, acid chloride or ester of a tetracarboxylic acid or trimellitic acid, and has a thickness of 2 to 300 μm.

* * * * *